US007574006B2

(12) United States Patent
Funayama et al.

(10) Patent No.: US 7,574,006 B2
(45) Date of Patent: Aug. 11, 2009

(54) ACTIVE NOISE CONTROLLER

(75) Inventors: Toshiyuki Funayama, Osaka (JP); Yoshio Nakamura, Osaka (JP); Masahide Onishi, Osaka (JP)

(73) Assignee: Panasonic Corporation, Osaka (JP)

( * ) Notice: Subject to any disclaimer, the term of this patent is extended or adjusted under 35 U.S.C. 154(b) by 542 days.

(21) Appl. No.: 10/587,566

(22) PCT Filed: Nov. 8, 2005

(86) PCT No.: PCT/JP2005/020407

§ 371 (c)(1), (2), (4) Date: Jul. 31, 2006

(87) PCT Pub. No.: WO2006/049293

PCT Pub. Date: May 11, 2006

(65) Prior Publication Data

US 2007/0172004 A1 Jul. 26, 2007

(30) Foreign Application Priority Data

Nov. 8, 2004 (JP) ............................ 2004-323362
Jun. 1, 2005 (JP) ............................ 2005-160971

(51) Int. Cl.
*H03B 29/00* (2006.01)

(52) U.S. Cl. ................ 381/71.12; 381/71.11; 381/71.4; 700/28; 704/226; 375/232

(58) Field of Classification Search ............. 381/71.11, 381/71.12, 71.4; 700/28, 280; 704/226
See application file for complete search history.

(56) References Cited

U.S. PATENT DOCUMENTS 5,170,433 A * 12/1992 Elliott et al. ................ 704/226
5,377,276 A * 12/1994 Terai et al. ............... 381/71.11
5,384,853 A * 1/1995 Kinoshita et al. ........ 381/71.12
5,544,080 A * 8/1996 Kobayashi et al. .......... 700/280
6,094,601 A * 7/2000 Popovich ..................... 700/28
6,216,047 B1 * 4/2001 Goto ........................... 700/28
7,062,049 B1 * 6/2006 Inoue et al. ................ 381/71.4
7,352,869 B2 * 4/2008 Inoue et al. .............. 381/71.11

FOREIGN PATENT DOCUMENTS

JP 3-204579 A 9/1991
JP 5-265468 A 10/1993
JP 6-118969 A 4/1994

(Continued)

OTHER PUBLICATIONS

U.S. Appl. No. 12/297,965 Claims; pp. 20-21; Oct. 21, 2008.*

*Primary Examiner*—Sudhanshu C Pathak
(74) *Attorney, Agent, or Firm*—McDermott Will & Emery LLP

(57) ABSTRACT

An active noise controller can determine the signal transmission characteristics from the power amplifier and the speaker to the microphone without using any special external measuring instrument and calculate a cosine correction value and a sine correction value without using an external computer. The active noise controller uses the cosine correction value and the sine correction value to actively reduce vibrational noise. The measurement mode is selected on touch panel (3), and correction value calculator (22) calculates cosine correction value C0 and sine correction value C1 by using filter coefficients W0 and W1 which allow error signal e'(n) to approach zero. Memory (23) stores these values C0 and C1.

25 Claims, 10 Drawing Sheets

FOREIGN PATENT DOCUMENTS

| | | | |
|---|---|---|---|
| JP | 2624858 | | 4/1997 |
| JP | 10-32891 | A | 2/1998 |
| JP | 2000-99037 | A | 4/2000 |
| JP | 2003-165394 | A | 6/2003 |
| JP | 2004-20714 | A | 1/2004 |

* cited by examiner

100

ACTIVE NOISE CONTROLLER

RELATED APPLICATIONS

This application is the U.S. National Phase under 35 U.S.C. 371 of International Application No. PCT/JP2005/020407, filed on Nov. 8, 2005, which in turn claims the benefit of Japanese Application No. 2004-323362, filed on Nov. 8, 2004, and Japanese Application No. 2005-160971, filed on Jun. 1, 2005, the disclosures of which Applications are incorporated by reference herein.

TECHNICAL FIELD

The present invention relates to an active noise controller for actively reducing vibrational noise generated from vehicles and the like.

BACKGROUND ART

Well-known conventional active noise controllers operate as follows. First, signal transmission characteristics from a vibrational noise canceller having a speaker to an error signal generator having a microphone are determined by using a special external measuring instrument. Then, a cosine correction value and a sine correction value are calculated based on the signal transmission characteristics by using an external computer. Next, the cosine correction value and the sine correction value are stored in a memory of a corrector. Finally, vibrational noise generated from a vehicle or the like is actively reduced based on the cosine correction value and the sine correction value stored in the memory.

A conventional technique relating to the invention of the present application is shown in Japanese Patent Unexamined Publication No. 2000-99037. Such conventional active noise controllers have the following disadvantages. A special external measuring instrument is necessary to determine the signal transmission characteristics between the vibrational noise canceller and the error signal generator. A computer is also necessary to calculate the cosine correction value and the sine correction value based on the determination results of the signal transmission characteristics.

SUMMARY OF THE INVENTION

An object of the present invention is to provide an active noise controller which can determine signal transmission characteristics from a vibrational noise canceller to an error signal generator without using any special external measuring instrument. The active noise controller can also calculate a cosine correction value and a sine correction value of the signal transmission characteristics without using a computer and store the cosine correction value and the sine correction value calculated to a memory of a corrector. The cosine correction value and the sine correction value are used to actively reduce vibrational noise.

The active noise controller of the present invention includes the following components:

(a) a mode selector for selecting between normal mode and measurement mode;

(b) a frequency detector for detecting a frequency of vibrational noise generated from a vibrational noise source based on the normal mode selected by the mode selector;

(c) a first switch for selecting between an output signal of a pseudo-vibrational noise generator for outputting a signal in a predetermined frequency range corresponding to the frequency of the vibrational noise generated from the vibrational noise source based on the measurement mode selected by the mode selector and an output signal of the frequency detector, and outputting the output signal selected;

(d) a reference cosine wave generator and a reference sine wave generator for receiving the output signal of the first switch;

(e) a first adaptive notch filter for outputting a first control signal based on the reference cosine wave signal outputted from the reference cosine wave generator in order to cancel the vibrational noise generated, based on the vibrational noise from the vibrational noise source;

(f) a second adaptive notch filter for outputting a second control signal based on the reference sine wave signal outputted from the reference sine wave generator;

(g) a first adder for receiving the first control signal and the second control signal;

(h) a second switch for supplying a signal outputted from the first adder to a vibrational noise canceller;

(i) a third switch for supplying one of the reference cosine wave signal and the reference sine wave signal to the vibrational noise canceller;

(j) the vibrational noise canceller for canceling the vibrational noise generated, the vibrational noise canceller receiving an output of the second switch and an output of the third switch;

(k) an error signal detector for outputting an error signal resulting from interference between the vibrational noise generated and a noise-canceling sound outputted from the vibrational noise canceller;

(l) a fourth switch for receiving the output of the first adder to a second adder;

(m) the second adder for receiving an output of the fourth switch and the output of the error signal detector;

(n) a fifth switch for outputting the reference cosine wave signal to a third adder;

(o) a sixth switch for outputting the reference sine wave signal to a fourth adder;

(p) a first filter coefficient updater for calculating a filter coefficient of the first adaptive notch filter based on an output signal of the second adder and an output signal of the fifth switch so as to minimize the output signal of the second adder, and for updating the filter coefficient sequentially;

(q) a second filter coefficient updater for calculating a filter coefficient of the second adaptive notch filter based on the output signal of the second adder and an output signal of the sixth switch so as to minimize the output signal of the second adder, and for updating the filter coefficient sequentially;

(r) a correction value calculator for receiving the filter coefficients of the first and second filter coefficient updaters, the correction value calculator being able to calculate at least a phase characteristic value out of a gain characteristic value and the phase characteristic value of signal transmission characteristics from the vibrational noise canceller to the error signal detector, corresponding to a frequency of one of the reference cosine wave signal and the reference sine wave signal, and also being able to calculate a cosine correction value and a sine correction value; and (s) a corrector for correcting the reference cosine wave signal and the reference sine wave signal by using the cosine correction value and the sine correction value, respectively, and outputting a corrected cosine wave signal and a corrected sine wave signal to the fifth switch and the sixth switch, respectively.

The corrector (s) includes:

(s1) a memory for storing the cosine correction value and the sine correction value;

(s2) a first multiplier for forming a product of the cosine correction value and the reference cosine wave signal;

(s3) a second multiplier for forming a product of the sine correction value and the reference sine wave signal;

(s4) a third multiplier for forming a product of the cosine correction value and the reference sine wave signal;

(s5) a fourth multiplier for forming a product of the sine correction value and the reference cosine wave signal;

(s6) the third adder for receiving an output signal of the first multiplier and an output signal of the second multiplier separately, and outputting the corrected cosine wave signal; and (s7) the fourth adder for receiving an output of the third multiplier and an output of the fourth multiplier separately, and outputting the corrected sine wave signal. This structure of the corrector makes it possible to determine the signal transmission characteristics from the vibrational noise canceller having a speaker to the error signal generator having a microphone without using any special external measuring instrument. The structure also makes it possible to calculate the cosine correction value and sine correction value of the signal transmission characteristics without using an external computer. The present invention provides an active noise controller which can store the calculated cosine correction value and sine correction value to the memory of the corrector and actively reduce vibrational noise by using the stored cosine correction value and sine correction value.

REFERENCE MARKS IN THE DRAWINGS

Figure 1:
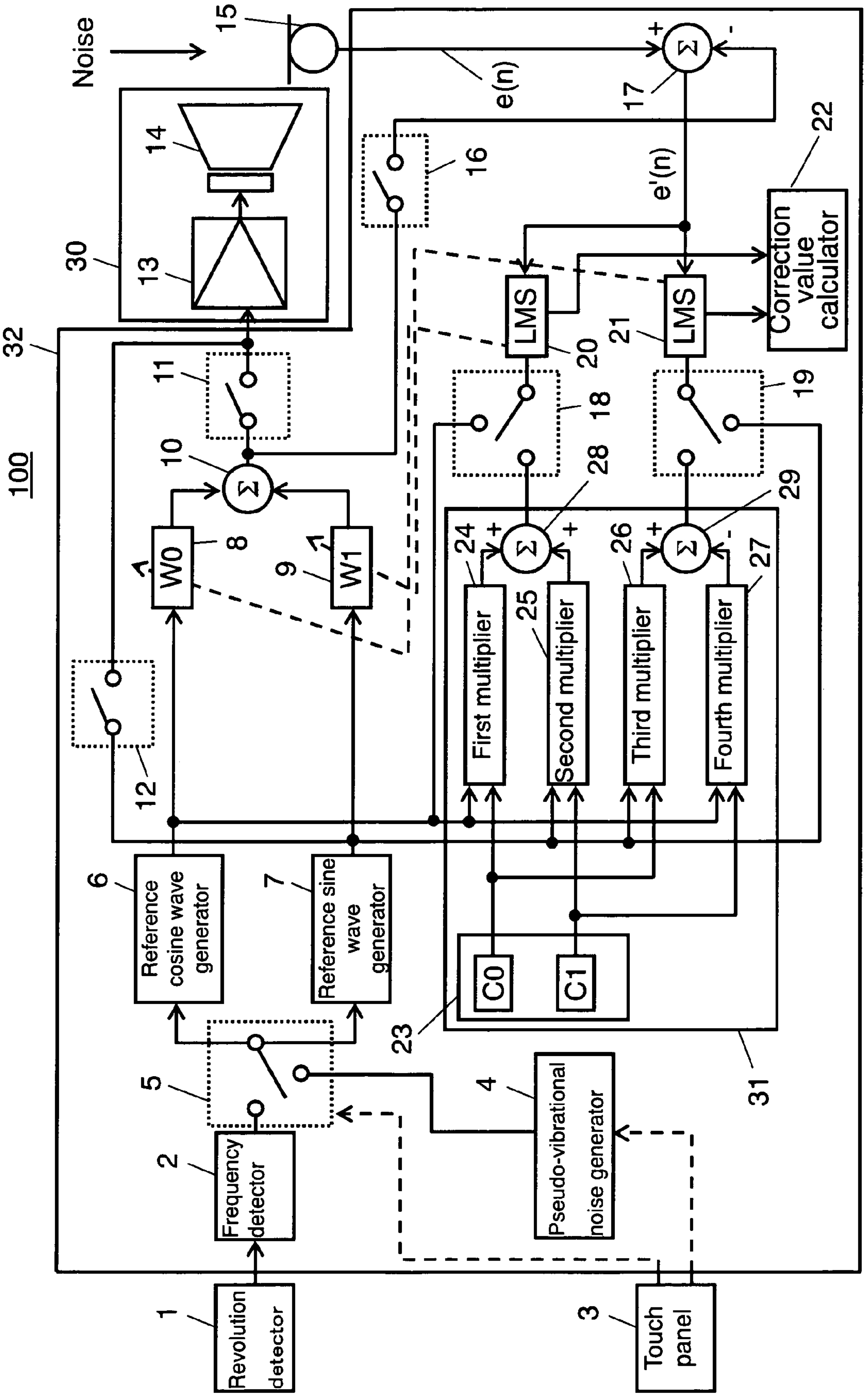
FIG. 1 is a block diagram showing a structure of an active noise controller of a first embodiment of the present invention.

1 revolution detector
2 frequency detector
3 touch panel (mode selector)
4 pseudo-vibrational noise generator
5 first switch
6 reference cosine wave generator
7 reference sine wave generator
8 first adaptive notch filter (W0)
9 second adaptive notch filter (W1)
10 first adder
11 second switch
12 third switch
13 power amplifier
14 speaker
15 microphone (error signal detector)
16 fourth switch
17 second adder
18 fifth switch
19 sixth switch
20 first adaptive control algorithm calculator (LMS, first filter coefficient updater)
21 second adaptive control algorithm calculator (LMS, second filter coefficient updater)
22 correction value calculator
23 memory
24 first multiplier
25 second multiplier
26 third multiplier
27 fourth multiplier
28 third adder
29 fourth adder
30 vibrational noise canceller
31 corrector
32 discrete calculation processor
40 first corrector
41 seventh switch
42 eighth switch
43 second corrector
44 third corrector
50 fourth corrector
100 active noise controller

DETAILED DESCRIPTION OF PREFERRED EMBODIMENTS

First Exemplary Embodiment

Figure 2:
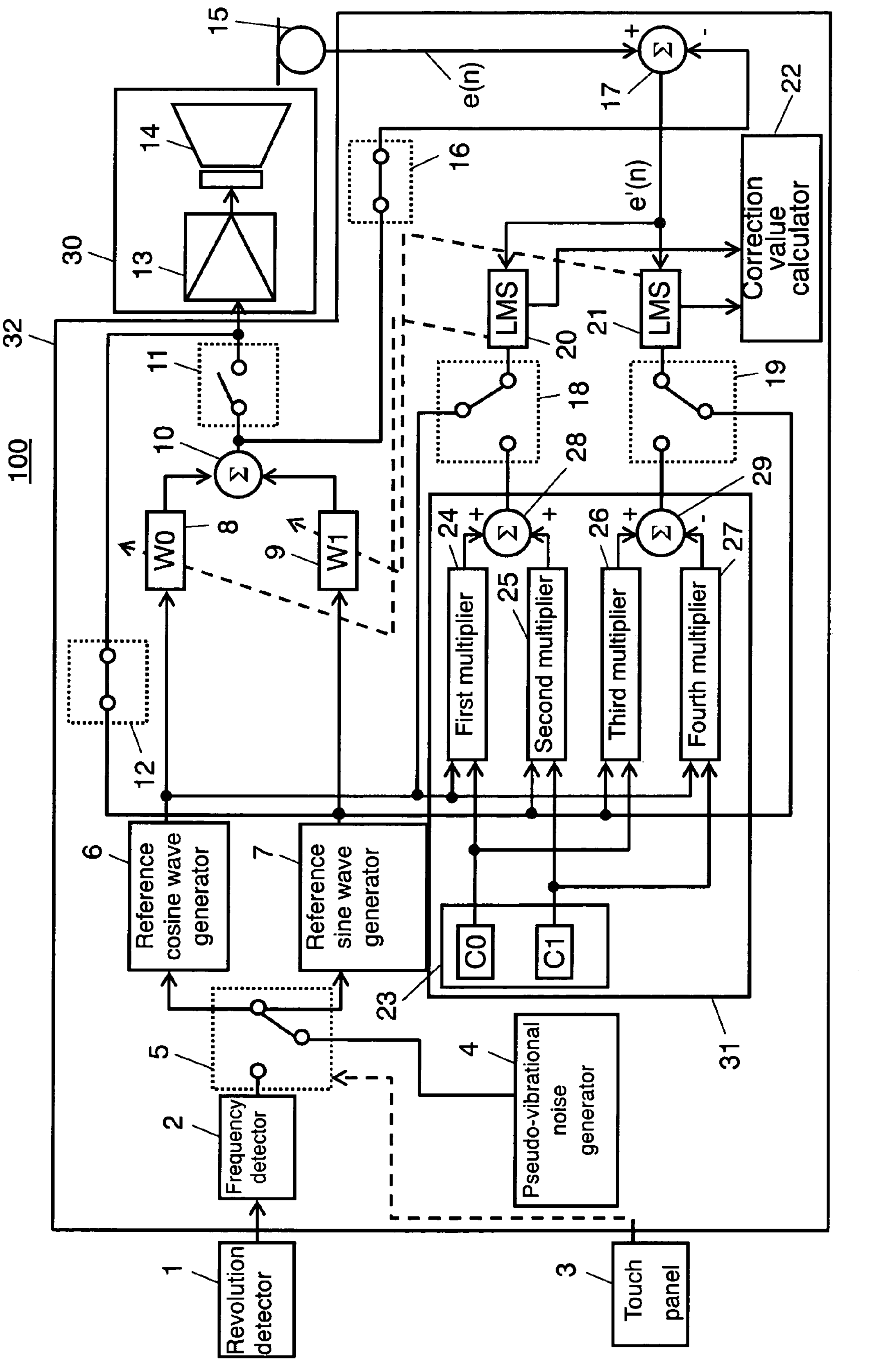
FIG. 2 is a block diagram showing operation of the active noise controller of the first embodiment of the present invention in measurement mode.
Figure 3:
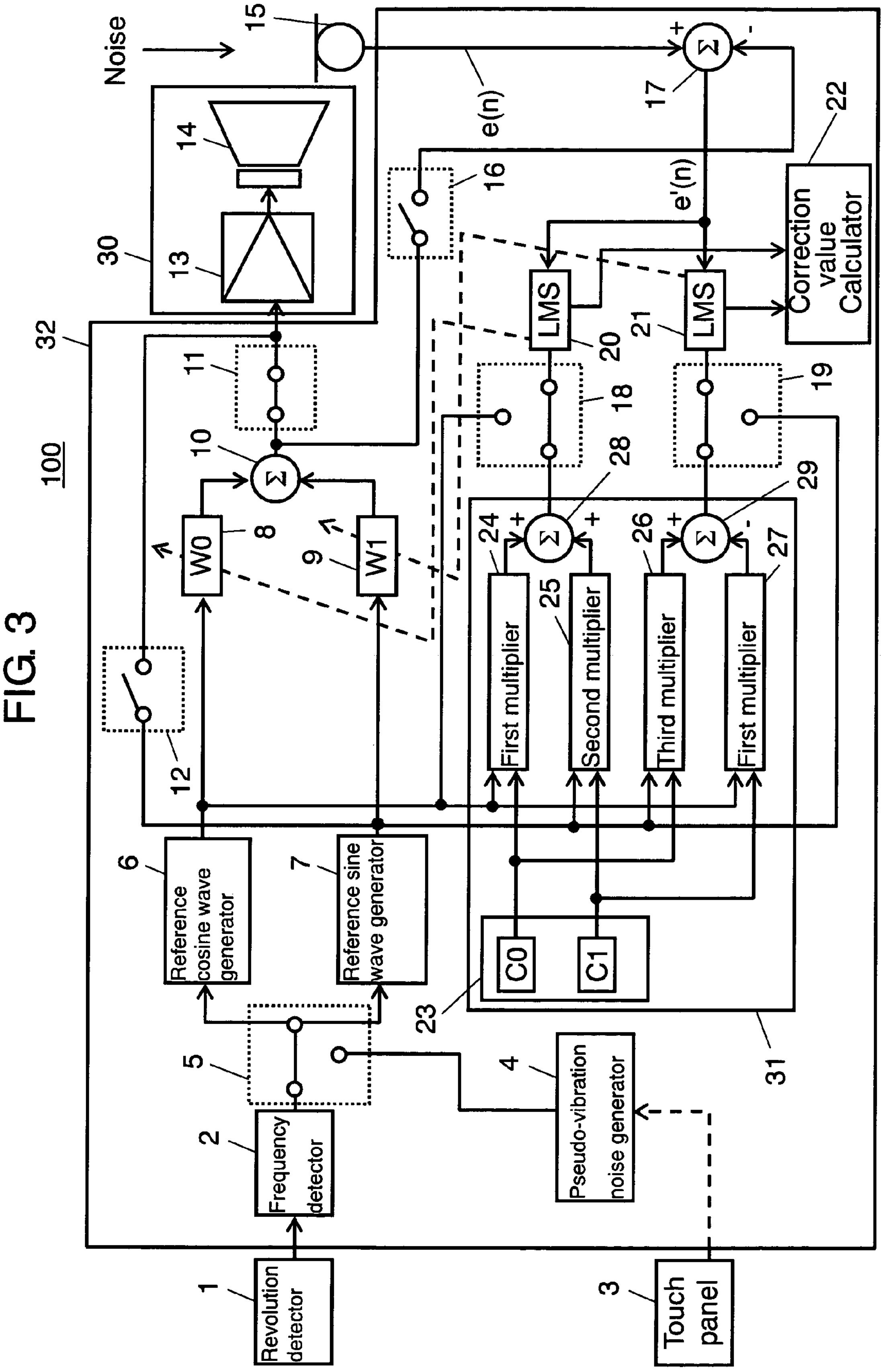
FIG. 3 is a block diagram showing operation of the active noise controller of the first embodiment of the present invention in normal mode.
Figure 4:
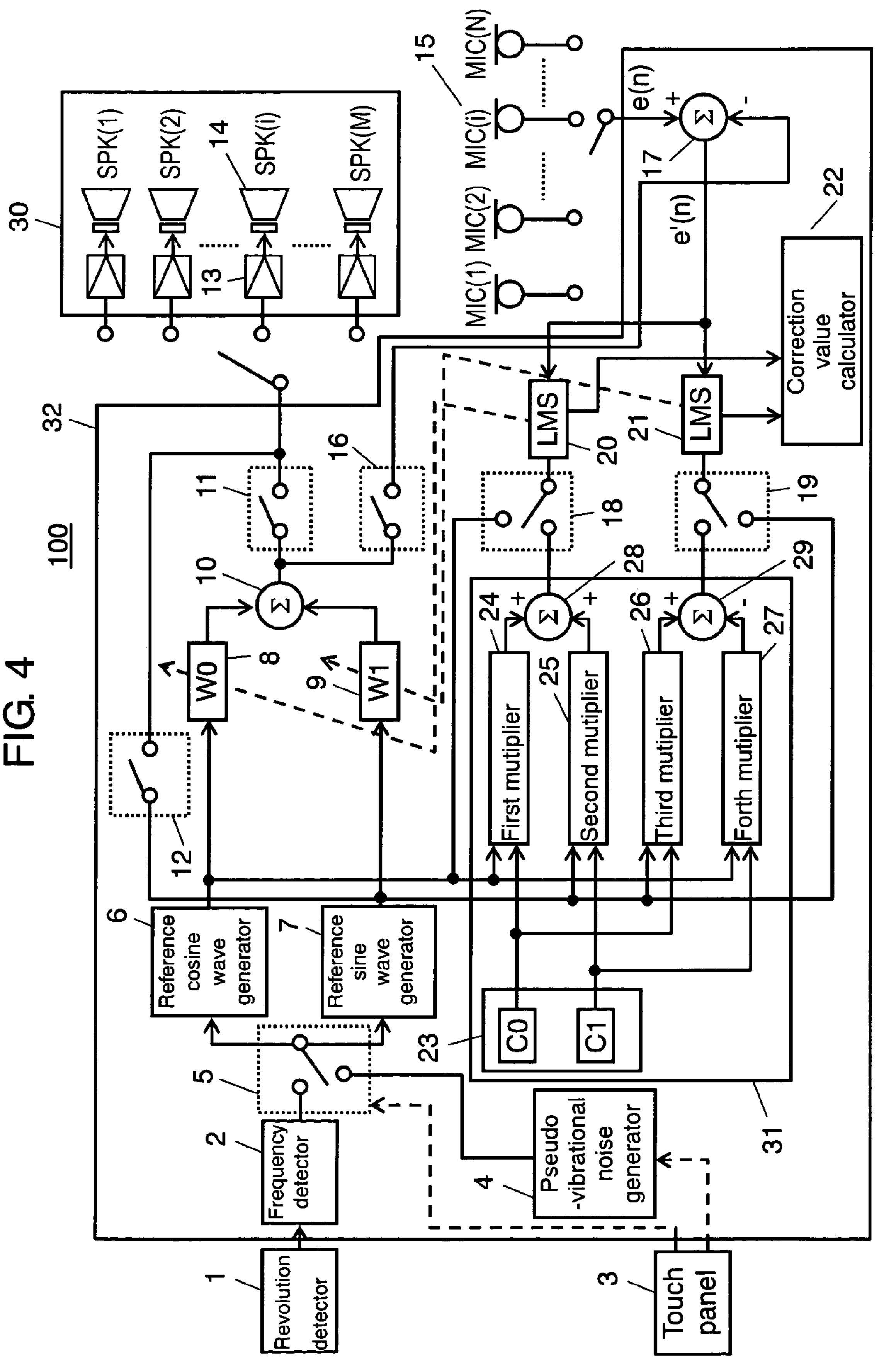
FIG. 4 is a block diagram showing a structure of the active noise controller of the first embodiment of the present invention having a plurality of speakers and microphones.

A first embodiment of the present invention will be described as follows with reference to FIGS. 1 to 4. FIG. 1 is a block diagram showing a structure of an active noise controller of the first embodiment of the present invention. FIG. 2 is a block diagram showing operation of the active noise controller shown in FIG. 1 in measurement mode. FIG. 3 is a block diagram showing operation of the active noise controller shown in FIG. 1 in normal mode. FIG. 4 is a block diagram showing operation of the active noise controller of the present invention shown in FIG. 1 having a plurality of vibrational noise cancellers or error signal detectors.

Active noise controller 100 shown in FIG. 1 can be roughly divided into revolution detector 1, touch panel 3, microphone 15, vibrational noise canceller 30 and discrete calculation processor 32. Vibrational noise canceller 30 includes power amplifier 13 and speaker 14.

Discrete calculation processor 32 includes frequency detector 2, pseudo-vibrational noise generator 4, first switch 5, reference cosine wave generator 6, reference sine wave generator 7, first adaptive notch filter 8, second adaptive notch filter 9, first adder 10, second switch 11, third switch 12, fourth switch 16, second adder 17, fifth switch 18, sixth switch 19, first adaptive control algorithm calculator 20, second adaptive control algorithm calculator 21, correction value calculator 22, and corrector 31.

Each of frequency detector 2, pseudo-vibrational noise generator 4, first switch 5, reference cosine wave generator 6, reference sine wave generator 7, first adaptive notch filter 8, second adaptive notch filter 9, first adder 10, second switch 11, third switch 12, fourth switch 16, second adder 17, fifth switch 18, sixth switch 19, first adaptive control algorithm calculator 20, second adaptive control algorithm calculator 21, correction value calculator 22, first multiplier 24, second multiplier 25, third multiplier 26, fourth multiplier 27, third adder 28, and fourth adder 29 is a software device including a CPU and the like.

However, it is possible to construct at least one of first to sixth switches 5, 11, 12, 16, 18, and 19 in hardware.

In active noise controller 100 shown in FIG. 1, revolution detector 1 detects the revolution of the engine mounted on a vehicle. Frequency detector 2 receives an engine pulse detected by revolution detector 1 and then outputs a frequency signal corresponding to the pulse. Touch panel 3 as a mode selector includes an operation input portion of an audio system mounted on the vehicle. Pseudo-vibrational noise generator 4 generates a signal having a predetermined frequency in response to the selection of measurement mode by touch panel 3.

First switch 5 selectively outputs either the output signal of frequency detector 2 or the output signal of pseudo-vibrational noise generator 4 in accordance with the selection instruction of touch panel 3. Reference cosine wave generator 6 generates a reference cosine wave signal based on an output signal of first switch 5. Reference sine wave generator 7 generates a reference sine wave signal based on an output signal of first switch 5.

First adaptive notch filter 8 outputs a first control signal based on the reference cosine wave signal of reference cosine wave generator 6. Second adaptive notch filter 9 outputs a second control signal based on the reference sine wave signal of reference sine wave generator 7.

First adder 10 receives the first control signal and the second control signal separately. Second switch 11 is provided to activate and interrupt the supply of a signal from first adder 10 to vibrational noise canceller 30. Switch 11 shown in FIG. 1 is in an open state, that is, an interrupted state. Third switch 12 is provided to activate and interrupt the supply of the reference sine wave signal to vibrational noise canceller 30. Switch 12 shown in FIG. 1 is in an open state, that is, an interrupted state.

Power amplifier 13 receives an output signal of second switch 11 and an output signal of third switch 12. Speaker 14 receives an output signal of power amplifier 13. Microphone 15 has a feature as an error signal detector outputting an error signal. The error signal results from interference between the vibrational noise generated from the engine as a vibrational noise source and the noise-canceling sound outputted from speaker 14.

Fourth switch 16 activates and interrupts the supply of the output of first adder 10 to second adder 17. Second adder 17 receives the output of fourth switch 16 and the output of microphone 15 separately. Fifth switch 18 outputs the reference cosine wave signal of reference cosine wave generator 6 to third adder 28 at the direction of touch panel 3.

Sixth switch 19 outputs the reference sine wave signal to fourth adder 29 at the direction of touch panel 3. First adaptive control algorithm calculator 20 calculates a filter coefficient of first adaptive notch filter 8 and updates the coefficient. Second adaptive control algorithm calculator 21 calculates a filter coefficient of second adaptive notch filter 9 and updates the coefficient. Correction value calculator 22 receives the filter coefficients of first and second adaptive control algorithm calculators 20 and 21 separately.

Correction value calculator 22 can calculate at least a phase characteristic value out of a gain characteristic value and the phase characteristic value of the signal transmission characteristics from power amplifier 13 and speaker 14 to microphone 15. The signal transmission characteristics correspond to the frequency of the reference sine wave signal. Correction value calculator 22 can also calculate cosine correction value C0 and sine correction value C1. Memory 23 stores cosine correction value C0 and sine correction value C1. First multiplier 24 forms the product of cosine correction value C0 and the reference cosine wave signal. Second multiplier 25 forms the product of sine correction value C1 and the reference sine wave signal. Third multiplier 26 forms the product of cosine correction value C0 and the reference sine wave signal. Fourth multiplier 27 forms the product of sine correction value C1 and the reference cosine wave signal. Third adder 28 receives the output signal of first multiplier 24 and the output signal of second multiplier 25 separately from its input side, and then outputs a corrected cosine wave signal from its output side. Fourth adder 29 receives the output signal of third multiplier 26 and the output signal of fourth multiplier 27 separately from its input side, and then outputs a corrected sine wave signal from its output side. Vibrational noise canceller 30 is composed of power amplifier 13 and speaker 14. Corrector 31 includes memory 23, first multiplier 24, second multiplier 25, third multiplier 26, fourth multiplier 27, third adder 28, and fourth adder 29.

Touch panel 3 used as the mode selector includes the operation input portion of an audio system which is an in-car apparatus. The active noise controller of the present invention having this structure can be conveniently used with widespread in-car apparatuses.

The use of an audio system as an in-car apparatus will be described as follows. It should be appreciated, however, that the in-car apparatus is not limited to an audio system and can be a car navigation system or the like.

Touch panel 3, which will be described as follows as the mode selector, includes the operation input portion of an audio system as an in-car apparatus. However, touch panel 3 is not the only example to be used as the mode selector, and a speech recognizer having a mechanical switch or a microphone can be alternatively used. The use of a speech recognizer allows not only the easy selection between measurement mode and normal mode but also the construction of a mode selector that does not need manual operation.

The following is a description of operation of the active noise controller in measurement mode with reference to FIG. 2. The same components as those in FIG. 1 will be referred to with the same reference numerals and symbols as those in FIG. 1.

In response to the selection of the measurement mode in touch panel 3, pseudo-vibrational noise generator 4 begins to operate. Pseudo-vibrational noise generator 4 outputs an output signal having a predetermined frequency. The output signal is selected by first switch 5 and then inputted to reference cosine wave generator 6 and reference sine wave generator 7 separately.

Reference sine wave generator 7 supplies a reference sine wave signal, which is synchronous with the frequency of the output signal of pseudo-vibrational noise generator 4, to power amplifier 13 via third switch 12. Power amplifier 13 inputs its output to speaker 14. Speaker 14 emits the reference sine wave signal as sound, and microphone 15 detects the emitted sound as error signal e(n) and inputs it to second adder 17.

Reference cosine wave generator 6 outputs a reference cosine wave signal, which is multiplied by filter coefficient W0(*n*) at first adaptive notch filter 8. The reference sine wave signal outputted from reference sine wave generator 7 is multiplied by filter coefficient W1(*n*) at second adaptive notch filter 9. First adaptive notch filter 8 outputs an output signal and second adaptive notch filter 9 outputs an output signal, which are added to each other at first adder 10. First adder 10 inputs its output signal to second adder 17 via fourth switch 16. Second adder 17 subtracts the output signal of first adder 10 from error signal e(n) detected by microphone 15 and then outputs the subtracted signal as error signal e'(n). Error signal e'(n) is inputted to first and second adaptive control algorithm calculators 20 and 21 separately.

The following is a description of how filter coefficient W0(*n*) of first adaptive notch filter 8 and filter coefficient W1(*n*) of second adaptive notch filter 9 are updated based on an adaptive control algorithm. One well-known adaptive control algorithm is an LMS (Least Mean Square) algorithm, which is the steepest descent method. Filter coefficients W0(*n*) and W1(*n*) of first and second adaptive notch filters 8 and 9, respectively, are updated by first and second adaptive control algorithm calculators 20 and 21, respectively, based on this algorithm. Filter coefficient W0(*n*+1) of first adaptive notch filter 8 and filter coefficient W1(*n*+1) of second adaptive notch filter 9 can be calculated as in formulas (1) and (2), respectively, by using the following: filter coefficients W0(*n*) and W1(*n*) of first and second adaptive notch filters 8 and 9, respectively, immediately before being updated; error signal e'(n); reference cosine wave signal r0'(*n*) and reference sine wave signal r1'(*n*) which are outputted from reference cosine wave generator 6 and reference sine wave generator 7, respectively; and step-size parameter "μ". Step-size parameter "μ" determines the convergence rate in the steepest descent method.

$$W0(n+1)=W0(n)+\mu\cdot e'(n)\cdot r0'(n) \quad (1)$$

$$W1(n+1)=W1(n)+\mu\cdot e'(n)\cdot r1'(n) \quad (2)$$

This is how filter coefficients W0(*n*) and W1(*n*) of first and second adaptive notch filters 8 and 9, respectively, are updated so that error signal e'(n) approaches zero and converge to optimum values. The term "converge to optimum values" means that formulas (3) and (4) with thresholds e0 and e1, respectively, are satisfied.

$$W0(n+1)-W0(n)<e0 \quad (3)$$

$$W1(n+1)-W1(n)<e1 \quad (4)$$

As a result that filter coefficients W0(*n*) and W1(*n*) of first and second adaptive notch filters 8 and 9, respectively, converge to the optimum values as described above, the output signal of first adder 10 and error signal e(n) detected by microphone 15 become equal to each other. In other words, the output signal of first adder 10 and error signal e(n) indicate the signal transmission characteristics from power amplifier 13 and speaker 14 to microphone 15.

Assuming that first adaptive notch filter 8 has a filter coefficient of W0' and second adaptive notch filter 9 has a filter coefficient of W1' after the convergence to the optimum values, error signal e(n) can be expressed by formulas (5) and (6).

$$e(n)=R\cdot\sin(\omega t+a) \quad (5)$$

$$=W0'\cdot\cos(\omega t)+W1'\cdot\sin(\omega t) \quad (6)$$

Inputting W0' and W1' to correction value calculator 22 and then performing the calculations shown in formulas (7) and (8) can calculate gain characteristic value G7 and phase characteristic value f7, respectively, of the signal transmission characteristics.

$$G7=v(W0'^2+W1'^2)^{0.5} \quad (7)$$

$$f7=-\arctan(W0'/W1') \quad (8)$$

Inputting filter coefficients W0' and W1' to correction value calculator 22 and then performing the calculations shown in formulas (9) and (10) can calculate cosine correction value C0 and sine correction value C1, respectively.

$$C0=v(W0'^2+W1'^2)^{0.5}\cos\{-\arctan(W0'/W1')\} \quad (9)$$

$$C1=v(W0'^2+W1'^2)^{0.5}\sin\{-\arctan(W0'/W1')\} \quad (10)$$

Cosine correction value C0 and sine correction value C1 are stored in memory 23 to complete the procedure in the measurement mode.

The aforementioned calculation steps allow the determination of the signal transmission characteristics from power amplifier 13 and speaker 14 to microphone 15 without using any special external measuring instrument. The calculation steps also allow the determination of cosine correction value C0 and sine correction value C1 without using an external computer. Cosine correction value C0 and sine correction value C1 are stored in memory 23 of corrector 31.

Discrete calculation processor 32 shown in FIG. 2 includes a second memory (not illustrated) for storing a gain characteristic value and a phase characteristic value calculated by correction value calculator 22. There is also provided a comparator (not illustrated) which compares at least a phase characteristic value calculated first with a phase characteristic value calculated later by correction value calculator 22. The comparator then determines whether the difference between these values is within a predetermined value, out of the gain characteristic value and the phase characteristic value calculated first and the gain characteristic value and the phase characteristic value calculated later. These components can offer a new feature described below.

The comparator can issue a warning when the difference between the phase characteristic values exceeds the predetermined value. More specifically, the driver of the vehicle can be informed of changes in the signal transmission characteristics from speaker 14 to microphone 15.

When the comparator determines that the difference between the phase characteristic values exceeds the predetermine value, correction value calculator 22 calculates a cosine correction value and a sine correction value again by using the filter coefficients respectively outputted from first and second adaptive control algorithm calculators 20 and 21. First and second adaptive control algorithm calculators 20 and 21 are a first filter coefficient updater and a second filter coefficient updater, respectively. The cosine correction value and sine correction value thus calculated are stored in memory 23. This can fully cancel vibrational noise again when there are changes in the signal transmission characteristics from speaker 14 to microphone 15 of the present invention.

If the engine is in the stopped state when the measurement mode is selected on touch panel 3, it is prevented that the vehicle occupants hear uncomfortable sound from speaker 14 which is emitted for testing.

The following is a description of operation in normal mode with reference to FIG. 3. The same components as those in FIGS. 1 and 2 will be referred to with the same reference numerals and symbols as those in FIGS. 1 and 2. When the normal mode is selected on touch panel 3, the engine revolution detected by revolution detector 1 is converted to a pulse-shaped signal and supplied to frequency detector 2. The output signal of frequency detector 2 is selected by first switch 5 and inputted to reference cosine wave generator 6 and reference sine wave generator 7.

Reference cosine wave generator 6 and reference sine wave generator 7 generate a reference cosine wave signal and a reference sine wave signal, respectively, which are synchronous with the frequency of the output signal of frequency detector 2.

The reference cosine wave signal of reference cosine wave generator 6 is multiplied by filter coefficient W0($n$) at first adaptive notch filter 8. The reference sine wave signal of reference sine wave generator 7 is multiplied by filter coefficient W1($n$) at second adaptive notch filter 9. First adaptive notch filter 8 outputs an output signal and second adaptive notch filter 9 outputs an output signal, which are added to each other at first adder 10. First adder 10 supplies its output signal to power amplifier 13 via second switch 11. Power amplifier 13 inputs its output to speaker 14. Speaker 14 emits noise-canceling sound for canceling the vibrational noise generated by the engine.

However, the initial noise-canceling sound emitted from speaker 14 when the normal mode is selected on touch panel 3 is not enough to cancel the vibrational noise generated by the engine.

The following is a description of a signal processing to fully cancel the vibrational noise using the present invention. First, the vibrational noise generated by the engine and the initial noise-canceling sound emitted from speaker 14 interfere with each other. At this moment, the sound that remains without being cancelled is detected by microphone 15.

Microphone 15 detects the remaining sound as error signal e(n). Microphone 15 then inputs error signal e(n) as error signal e(n) to first and second adaptive control algorithm calculators 20 and 21 via second adder 17. The error signal e(n) is used in the adaptive control algorithm for updating filter coefficients W0($n$) and W1($n$) of first and second adaptive notch filters 8 and 9, respectively.

Then, reference cosine wave signal (cos ωt) is multiplied by cosine correction value C0 stored in memory 23 at first multiplier 24. Reference sine wave signal (sin ωt) is multiplied by sine correction value C1 stored in memory 23 at second multiplier 25. Third adder 28 receives an output signal of first multiplier 24 and an output signal of second multiplier 25. On the other hand, reference sine wave signal (sin ωt) is multiplied by cosine correction value C0 stored in memory 23 at third multiplier 26. Reference cosine wave signal (cos ωt) is multiplied by sine correction value C1 stored in memory 23 at fourth multiplier 27. Fourth adder 29 receives an output signal of third multiplier 26 and an output signal of fourth multiplier 27. As a result, third adder 26 and fourth adder 27 can output corrected cosine wave signal r0($n$) and corrected sine wave signal r1($n$), respectively, which are expressed by formula (11) and formula (12), respectively.

$$r0(n)=C0\cdot\cos\omega t+C1\cdot\sin\omega t \quad (11)$$

$$r1(n)=C0\cdot\sin\omega t-C1\cdot\cos\omega t \quad (12)$$

Corrected cosine wave signal r0($n$) and corrected sine wave signal r1($n$) are inputted to first and second adaptive control algorithm calculators 20 and 21, respectively, and used in the adaptive control algorithm for updating filter coefficients W0($n$) and W1($n$) of first and second adaptive notch filters 8 and 9, respectively.

The following is a description of a signal processing to update filter coefficients W0($n$) and W1($n$) of first and second adaptive notch filters 8 and 9, respectively, by the adaptive control algorithm. Similar to the case of measurement mode, filter coefficients W0($n$) and W1($n$) of first and second adaptive notch filters 8 and 9, respectively, are updated based on the LMS algorithm by first and second adaptive control algorithm calculators 20 and 21, respectively.

Next, filter coefficient W0($n$+1) of first adaptive notch filter 8 and filter coefficient W1($n$+1) of second adaptive notch filter 9, which are updated by first and second adaptive control algorithm calculators 20 and 21, respectively, can be calculated by formula (13) and formula (14), respectively, by using the following: filter coefficients W0($n$) and W1($n$) of first and second adaptive notch filters 8 and 9, respectively, immediately before being updated; error signal e(n); corrected cosine wave signal r0($n$) and corrected sine wave signal r1($n$) outputted from third and fourth adders 28 and 29, respectively, and step-size parameter "μ". As described above, step-size parameter "μ" determines the convergence rate in the steepest descent method.

$$W0(n+1)=W0(n)-\mu\cdot e(n)\cdot r0(n) \quad (13)$$

$$W1(n+1)=W1(n)-\mu\cdot e(n)\cdot r1(n) \quad (14)$$

This is how filter coefficients W0($n$) and W1($n$) of first and second adaptive notch filters 8 and 9, respectively, are updated so that error signal e(n) approaches zero and converge to optimum values. This indicates that the vibrational noise generated by the engine is fully cancelled by the noise-canceling sound emitted from speaker 14 which forms vibrational noise canceller 30.

The following is a description of operation of the active noise controller which has a plurality of vibrational noise cancellers 30 including a power amplifier 13 and a speaker 14, or a plurality of microphones 15 as the error signal detector with reference to FIG. 4.

Conventionally, in general vehicles, speakers are installed on front doors and rear doors, and a microphone is installed near the driver's seat. Therefore, the signal transmission characteristics from speaker 14 to microphone 15 used to be fixed to some extent (limited). These days, however, the growth in popularity of rear entertainment technology has made it more common to install Multi-Surround System with six or more speakers or hands-free microphones in the second and third seats in the car. This is increasing the freedom of choice of the signal transmission characteristics from the speaker to the microphone. As a result, it becomes possible to select and store better signal transmission characteristics in the measurement mode and to use the characteristics in the normal mode, thereby providing better noise reduction effects.

Note that when there are a plurality of speakers 14 and a plurality of microphones 15, speakers 14 and microphones 15 are hereinafter referred to as SPK (i) and MIC (j), respectively. Also note that the vehicle has "M" speakers and "N" microphones and that "i" is an integer of 1 to "M", and "j" is an integer of 1 to "N".

The aforementioned description of the operation in the measurement mode shows a case where SPK (i) and MIC (j) have the fixed signal transmission characteristics. In such cases, even if speakers and microphones are placed in the fixed positions, when the signal transmission gain characteristics from SPK (i) to MIC (j) do not have a level decrease or dips, there are no problems. This makes it relatively easy to control noise reduction. However, in a vehicle having an active noise controller installed therein, signal transmission gain characteristics often have peaks or dips unique to cars. This makes it unstable to control noise reduction in a frequency band near the dips. As another problem, in a frequency band having a low level of signal transmission gain characteristics, the noise-canceling sound emitted from the speaker as the vibrational noise canceller necessarily grows larger, thereby causing the speaker to emit distorted sound.

To solve this problem, in the measurement mode, SPK (i) are selected from the M speakers and MIC (j) are selected from the N microphones installed in the vehicle. Then, (M×N) types of gain characteristic values of the signal transmission characteristics from SPK (i) to MIC (j) are determined and stored in a third memory. A second comparator compares the (M×N) types of the gain characteristic values stored in the third memory and selects a combination of SPK (i) and MIC (j) that has the fewest deep dips and the highest gain level. Memory 23 stores the cosine correction value and the sine correction value calculated from the signal transmission characteristics from the selected SPK (i) to MIC (j). The use of the cosine correction value and sine correction value stored in memory 23 in the normal mode allows the provision of an active noise controller having higher noise reduction effects.

The second comparator compares the (M×N) types of gain characteristic values and selects a combination of SPK (i) and MIC (j) that has the fewest deep dips and the highest gain level for each frequency. Memory 23 stores the cosine correction value and sine correction value calculated from the signal transmission characteristics from SPK (i) to MIC (j) selected for each frequency. In the normal mode, the cosine correction value and sine correction value stored in memory 23 are used. This enables the provision of an active noise controller having high noise reduction effects even in a case where the signal transmission characteristics of SPK (i) to MIC (j) have dips and a low gain portion in all the frequency bands to be controlled with respect to noise reduction.

Second Exemplary Embodiment

Figure 5:
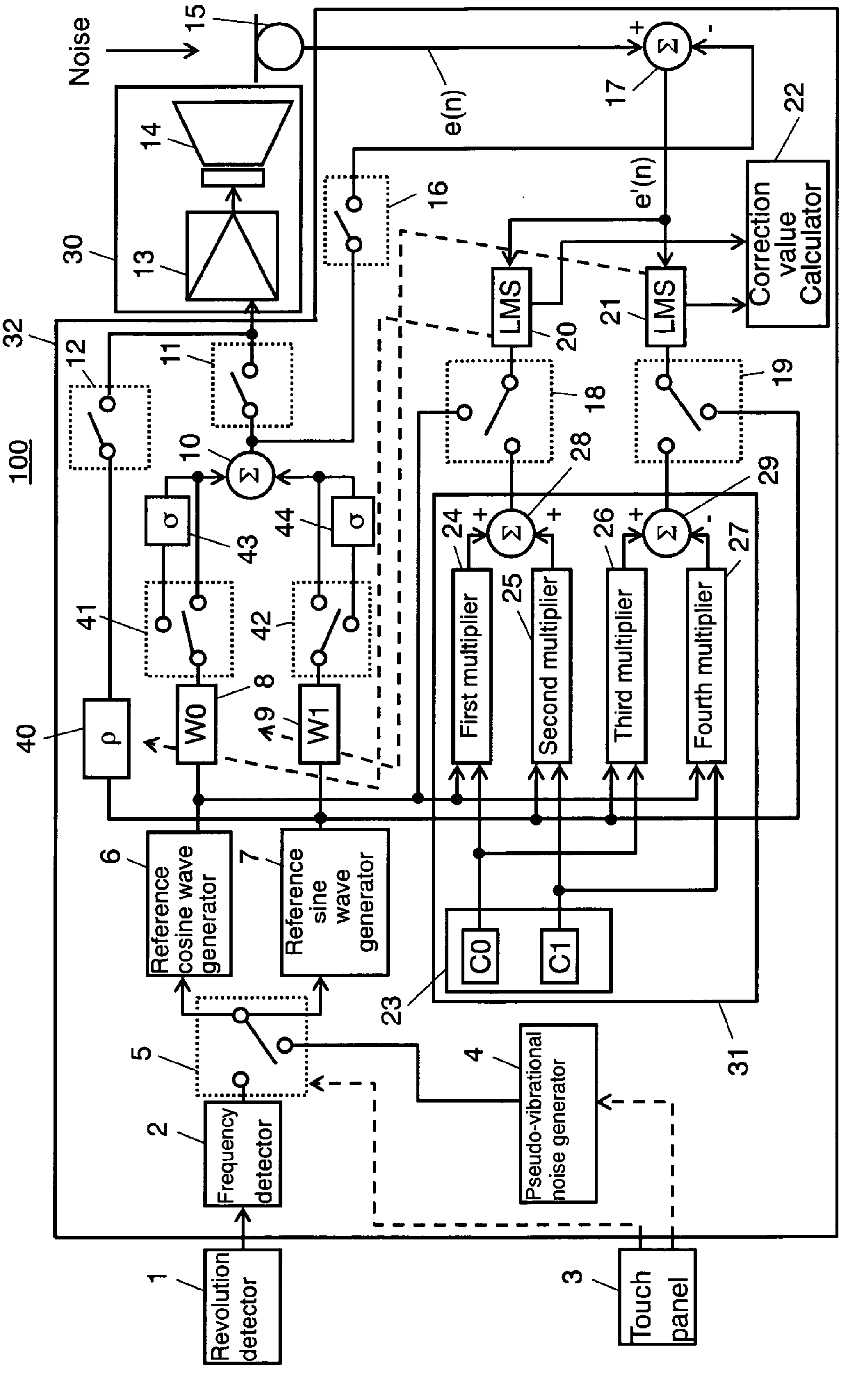
FIG. 5 is a block diagram showing a structure of an active noise controller of a second embodiment of the present invention.
Figure 6:
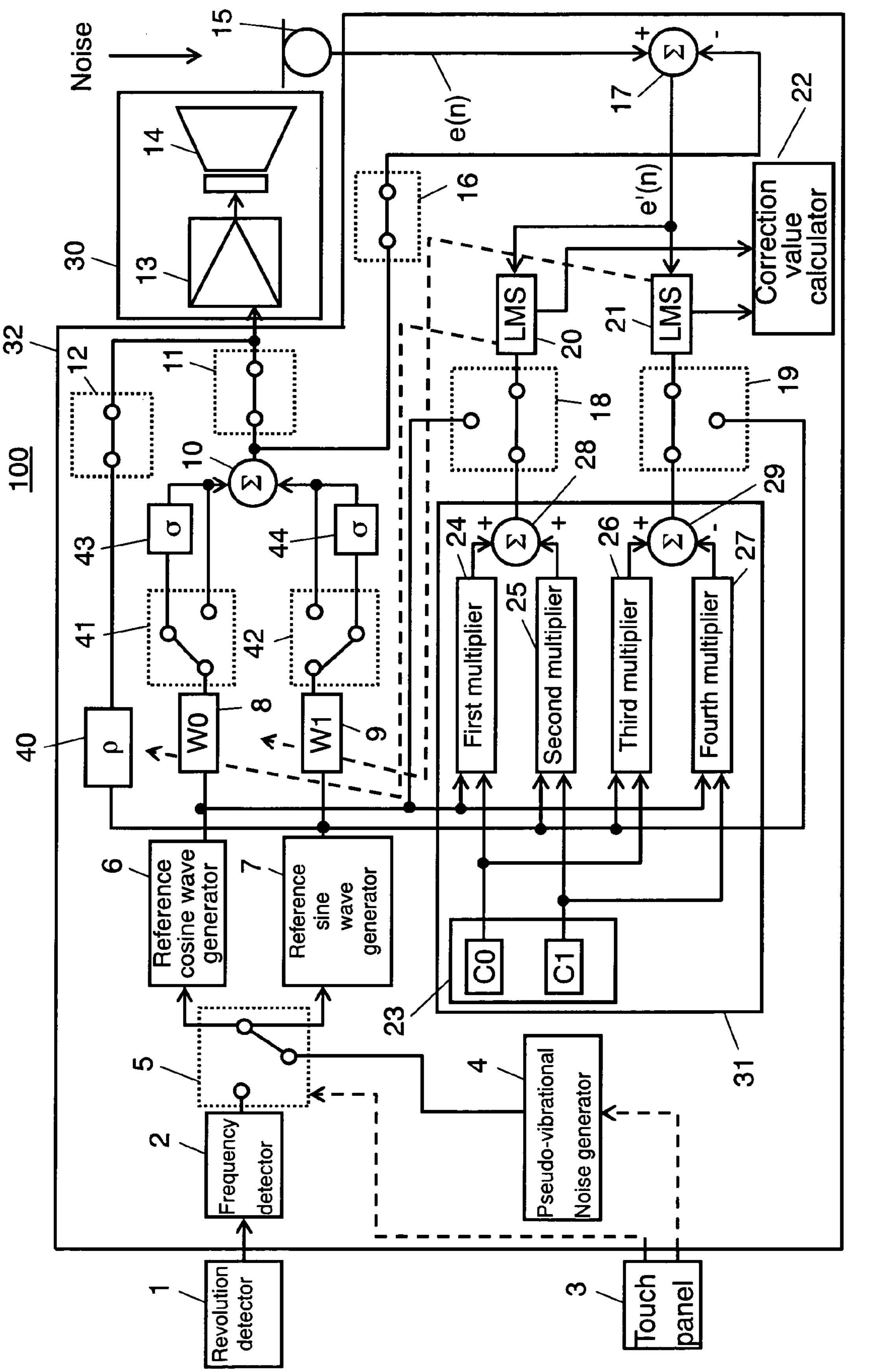
FIG. 6 is a block diagram showing operation of the active noise controller of the second embodiment of the present invention in measurement mode.
Figure 7:
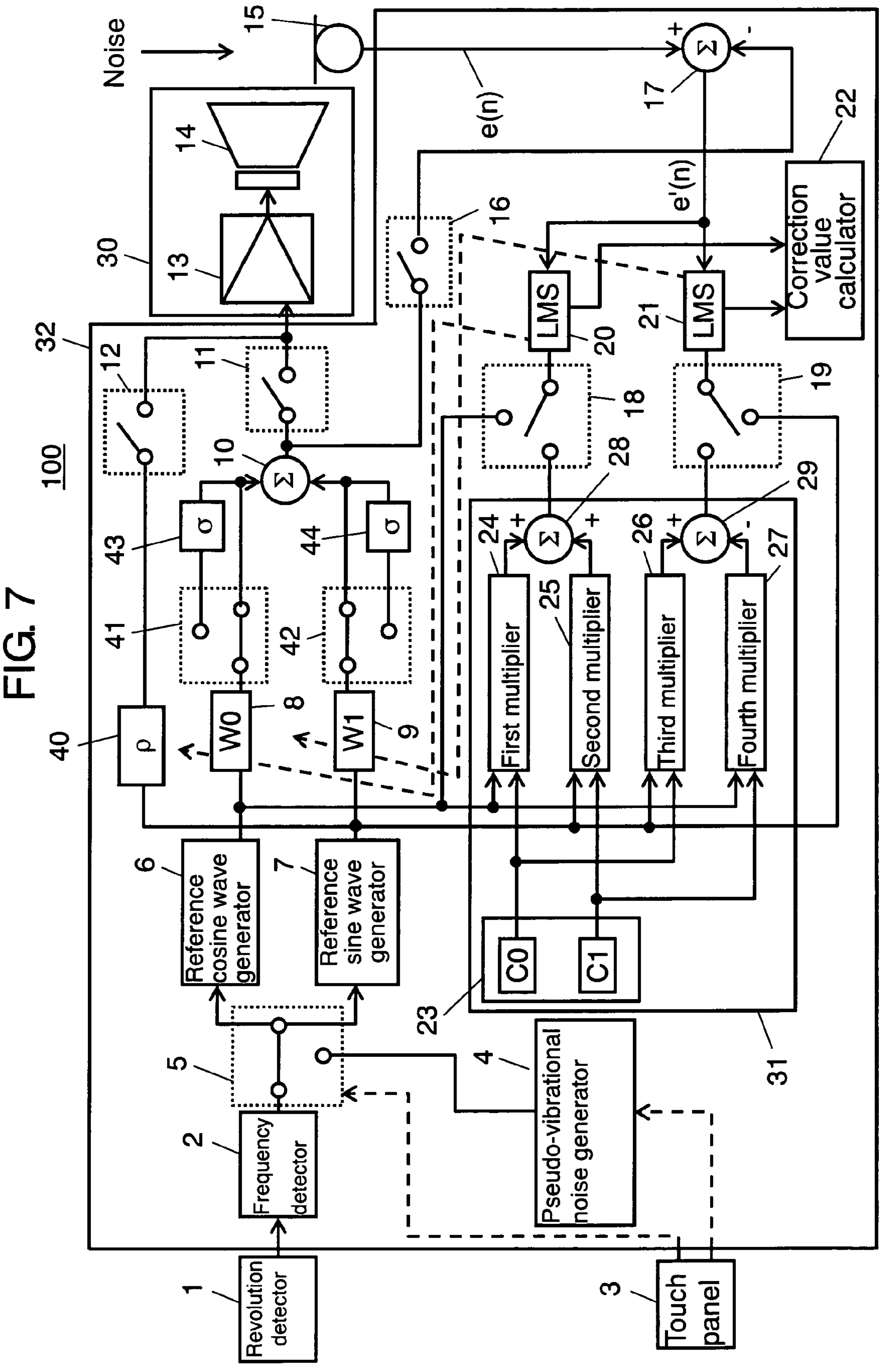
FIG. 7 is a block diagram showing operation of the active noise controller of the second embodiment of the present invention in normal mode.

FIG. 5 is a block diagram showing a structure of an active noise controller of a second embodiment. FIG. 6 is a block diagram showing operation in measurement mode, and FIG. 7 is a block diagram showing operation in normal mode. The same components as those in the first embodiment will be referred to with the same reference numerals and symbols as those in the first embodiment.

Active noise controller 100 includes first corrector 40 which corrects a reference sine wave signal outputted from the reference sine wave generator. When the measurement mode is currently selected, the signal corrected by first corrector 40 is inputted to power amplifier 13 via third switch 12. Seventh switch 41 supplies a signal to an input terminal on a side of the first adder at the direction of touch panel portion 3. This signal is obtained by multiplying the reference cosine wave signal of the reference cosine wave generator by filter coefficient W0 at first adaptive notch filter 8. Eighth switch 42 supplies a signal to an input terminal on the other side of the first adder at the direction of touch panel 3. This signal is obtained by multiplying a reference sine wave signal of the reference sine wave generator by filter coefficient W1 at second adaptive notch filter 9. Second corrector 43 corrects a signal outputted from the seventh switch in the measurement mode and inputs it to first adder 10. Third corrector 44 corrects a signal outputted from the eighth switch in the measurement mode and inputs it to first adder 10.

The second embodiment shown in FIGS. 5 to 7 differs from the first embodiment shown in FIGS. 1 to 3 in that having first corrector 40, seventh switch 41, eighth switch 42, second corrector 43, and third corrector 44.

A process for determining signal transmission characteristics in the measurement mode will be described as follows. For example, when the gain characteristics of the signal transmission characteristics from speaker 14 to microphone 15 far exceeds 0 dB, error signal e(n) detected by microphone 15 is also large. However, microphone 15 can detect signals with an upper limit in amplitude. Therefore, when the amplitude of the transmission signal exceeds the upper limit in the position of microphone 15, error signal e(n) does not have an accurate value.

Consequently, filter coefficients W0' and W1' of first and second adaptive notch filters 8 and 9, respectively, which are obtained from the converged value of the adaptive control algorithm calculation are not accurate. As a result, the gain characteristic value obtained from formula (7) is also inaccurate.

This problem is solved by providing first corrector 40, which corrects the reference sine wave signal so as to reduce the absolute value of correction value "ρ". This reduces the amplitude of the transmission signal in the position of microphone 15. As a result, error signal e(n) has an accurate value, making it possible to obtain an accurate gain characteristic value. The gain characteristic value can be expressed by formula (15) below.

$$G15=1/\rho\cdot v(W0'^2+W1'^2)^{0.5} \quad (15)$$

Even when the amplitude of the transmission signal in the position of microphone 15 does not exceed the detectable upper limit of microphone 15, if filter coefficients W0' and W1' have a limited range of values, then it is impossible to express the gain characteristic value of not less than 0 dB in a case where the coefficients are defined by Q7 format. The term "Q7 format" is one of the 8-bit fixed-point representation systems and assigns information of decimal places to low-order seven bits. Therefore, providing seventh switch 41, eighth switch 42, second corrector 43, and third corrector 44 makes it possible to express the gain characteristic value by formula (16) with correction value "s".

$$G16=s\cdot v(W0'^2+W1'^2)^{0.5} \quad (16)$$

An increase in the absolute value of correction value "s" can express W0' and W1' in an expressible range of values, making it possible to obtain the accurate gain characteristic value.

Even when the amplitude of the transmission signal in the position of microphone 15 exceeds the detectable upper limit of microphone 15, and filter coefficients W0' and W1' have a limited range of values, the gain characteristic value can be expressed by formula (17) by reducing the absolute value of correction value "ρ" and increasing the absolute value of correction value "s".

$$G17=s/\rho\cdot v(W0'^2+W1'^2)^{0.5} \quad (17)$$

The following is a description of a case where the gain characteristics of the signal transmission characteristics from speaker 14 to microphone 15 are far lower than 0 dB. In this case, first and second adaptive notch filters 8 and 9 have small filter coefficients W0' and W1', respectively, from the converged value of the adaptive control algorithm calculation based on formulas (5), (6), and (7). A reduction in the values of filter coefficients W0' and W1' causes the absolute error of 1 LSB to be larger.

Assume, for example, that when filter coefficients W0' and W1' are signed 8-bit values, the obtained values are W0'=1 and W1'=2. Assuming that the obtained values include an error of 1 LSB, and that the proper approximate values are W0'=2 and W1'=2, formula (8) indicates that the accurate approximate value of the phase characteristic value is 45 degrees, and the phase characteristic value calculated from W0' and W1' thus obtained is 26.6 degrees. As a result, the phase characteristic value has an error of 29 percent ((45−26.6)/45).

On the other hand, assume that filter coefficients W0' and W1' have large values, for example, W0'=99 and W1'=100; that these values include an error of 1 LSB; and that the accurate approximate values are W0'=100 and W1'=100. Formula (8) indicates that the accurate approximate value of the phase characteristic value is 45 degrees, and the phase characteristic value calculated from W0' and W1' thus obtained is 44.7 degrees. As a result, the phase characteristic value has an error of 0.7 percent ((45−44.7)/45).

Providing first corrector 40, which corrects a reference sine wave signal, can increase the absolute value of correction value "ρ", thereby increasing the amplitude of the transmission signal in the position of the microphone. This enables filter coefficients W0' and W1' to have large values, thereby reducing the error of the phase characteristic value. Further providing seventh switch 41, eighth switch 42, second corrector 43, and third corrector 44 allows the filter coefficients of first and second adaptive notch filters 8 and 9 obtained from the converged value of the adaptive control algorithm calculation to be expressed as s·W0' and s·W1', respectively.

A reduction in the absolute value of correction value "s" can increase the values of W0' and W1' and thus can reduce the error of the phase characteristic value. This is the reason for the additional provision of first corrector 40 for correcting the reference sine wave signal, seventh switch 41, eighth switch 42, second corrector 43, and third corrector 44. This structure enables filter coefficients W0' and W1' of first and second adaptive notch filters 8 and 9, respectively, to have large values, thereby further reducing the error of the phase characteristic value.

Third Exemplary Embodiment

Figure 8:
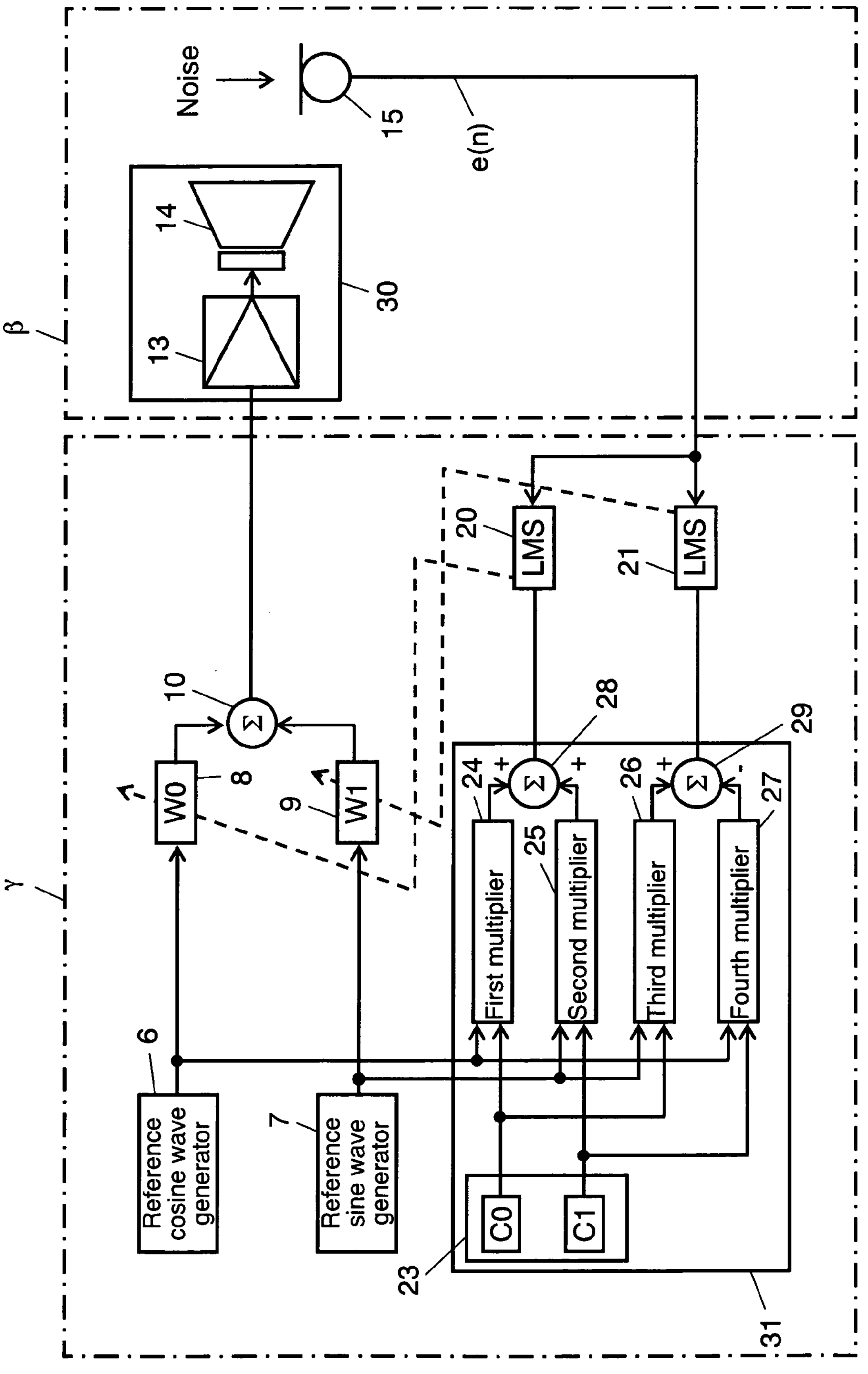
FIG. 8 is a block diagram showing a structure of an active noise controller of a third embodiment of the present invention in normal mode.
Figure 9:
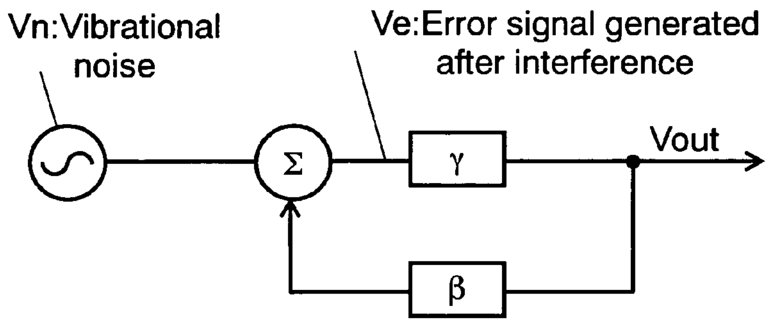
FIG. 9 is a simplified block diagram of the structure of the active noise controller of the third embodiment of the present invention.

A third embodiment will be described with reference to FIG. 8. FIG. 8 is a simplified block diagram of the block diagram (FIG. 3) showing operation of the active noise controller of the first embodiment in normal mode. FIG. 9 is a further simplified block diagram of the structure of FIG. 8. In FIG. 9 the signal transmission characteristics from noise canceller 30 consisting of power amplifier 13 and speaker 14 to microphone 15 are shown as "β", and the signal transmission characteristics of the adaptive filters are shown as "γ". The signal transmission characteristics of the adaptive filters correspond to the signal transmission characteristics either from the reference cosine wave signal of reference cosine wave generator 6 or from the reference restriction wave signal of reference restriction wave generator 7 to the output of first adder 10. According to the structure of FIG. 9, the relationship between vibrational noise Vn generated in the car, error signal Ve, output Vout, signal transmission characteristics "β" from vibrational noise canceller 30 to microphone 15, and signal transmission characteristics "γ" of the notch adaptive filters can be expressed by formulas (18) and (19). Furthermore, Ve/Vn can be expressed by formula (20) based on formulas (18) and (19).

$$Ve \cdot \gamma = V\text{out} \tag{18}$$

$$\beta \cdot V\text{out} = Ve - Vn \tag{19}$$

$$Ve/Vn = 1/(1-\beta\cdot\gamma) \tag{20}$$

Figure 10:
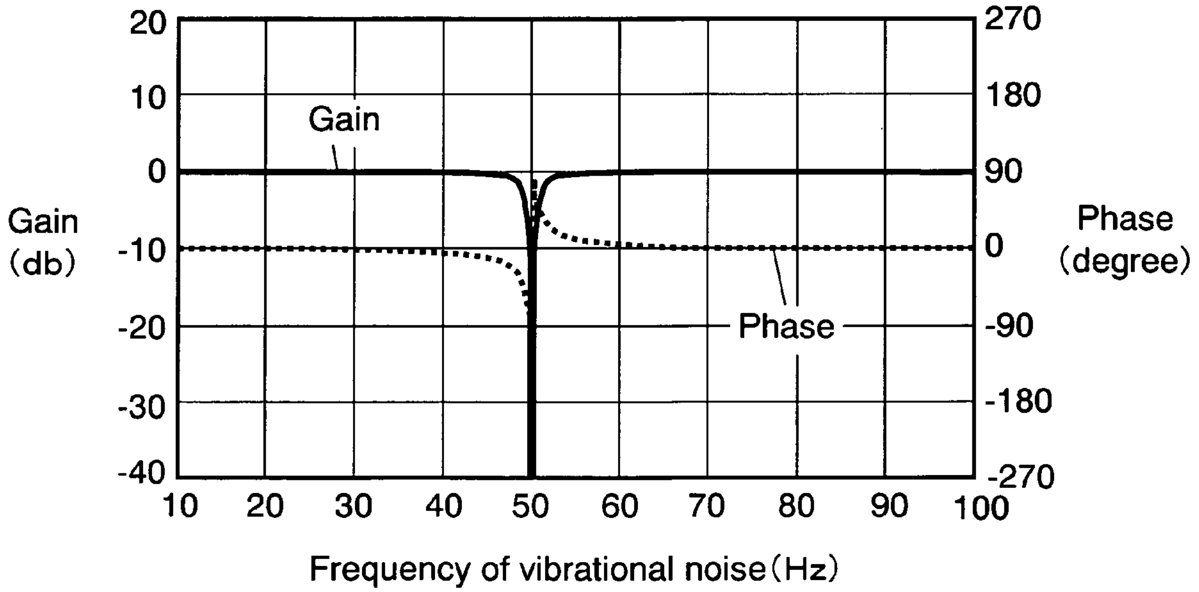
FIG. 10 is a view showing the characteristics of noise reduction effects of the active noise controller of the third embodiment of the present invention.

FIG. 10 shows Ve/Vn characteristics in the case that the reference cosine wave signal and the reference sine wave signal have a frequency of 50 Hz. This exactly shows the noise reduction effects of the active noise controller. In designing active noise controller 100, it is important to consider maintaining the characteristics. In other words, it is preferable to fix the product β·γ of signal transmission characteristics "β" and "γ" in order to keep the performance of the active noise controller.

For example when the user of a car having the active noise controller incorporated therein replaces power amplifier 13 or speaker 14 with an existing one after the active noise controller and the car having the controller are mass produced, the replacement may cause the signal transmission characteristics from noise canceller 30 to microphone 15 to change largely. This means that signal transmission characteristics "β" are changed. As described above, changes in signal transmission characteristics "β" have an ill effect on the performance of the active noise controller. A method for solving this problem will be described as follows.

Figure 11:
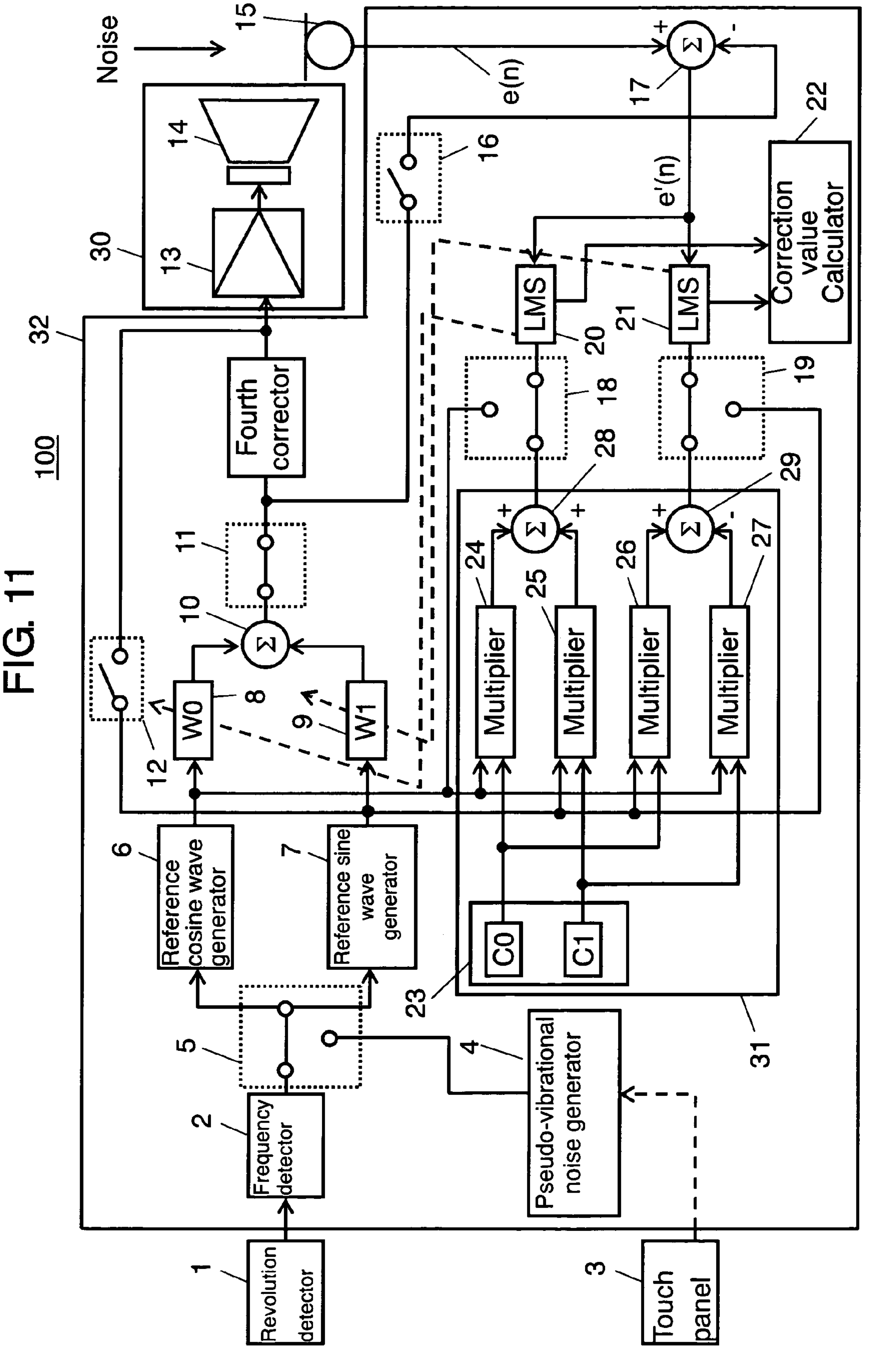
FIG. 11 is a block diagram showing a structure in which the active noise controller of the third embodiment of the present invention has a fifth corrector added.

FIG. 11 is a block diagram where the first adder shown in the block diagram of FIG. 3 in the normal operation mode is added with fourth corrector 50 at the output stage thereof. A correction value which is in inverse proportion to the gain characteristic value of the changed signal transmission characteristics from noise vibrational canceller 30 to microphone 15 can be applied to fourth corrector 50. As a result, the product γ·β of signal transmission characteristics "γ" and "β" can be kept constant.

Another method for keeping the product γ·β of signal transmission characteristics "γ" and "β" constant will be described as follows. First, signal transmission characteristics "γ" will be calculated more qualitatively. The amounts of update of filter coefficients W0 and W1 of first and second adaptive notch filters 8 and 9, respectively, which are updated in a single adaptive control calculation are referred to as ΔW0 and ΔW1, respectively. The amounts of update ΔW0 and ΔW1 can be expressed by formulas (21) and (22), respectively, based on formulas (13) and (14), respectively, when the reference cosine wave signal and the reference sine wave signal have a frequency of "ω0", and the vibrational noise has a frequency of "ω".

$$\Delta W0 = -(\exp(j\omega 0t)+\exp(-j\omega 0t)/2\cdot(\exp(j(\omega t+a))+\exp(-j(\omega t+a))/2\cdot\mu \tag{21}$$

$$\Delta W1 = -(\exp(j\omega 0t)-\exp(-j\omega 0t)/2j\cdot(\exp(j(\omega t+a))+\exp(-j(\omega t+a))/2\cdot\mu \tag{22}$$

If ωx=ω0+ω and ωy=ω0−ω, and A0 and A1 are arbitrary constants, then formulas (23) and (24) are satisfied.

$$\int \Delta W0 = -\mu/4\cdot\{\exp(j(\omega yt-a))/j\omega y-\exp(-j(\omega yt-a))/j\omega y\}+A0 \tag{23}$$

$$\int \Delta W1 = -\mu/4\cdot\{\exp(j(\omega yt-a))/j\omega y+\exp(-j(\omega yt-a))/j\omega y\}+A1 \tag{24}$$

Signal transmission characteristics "γ" can be expressed by formula (25).

$$\gamma = \int \Delta W0 \cdot (\exp(j\omega 0t) + \exp(-j\omega 0t)/2 + \int \Delta W1 \cdot (\exp(j\omega 0t) - \exp(-j\omega 0t)/2j \quad (25)$$

When being approximated using formulas (23) and (24), signal transmission characteristics "γ" can be expressed by formula (26).

$$\gamma = \mu/2(\omega 0 - \omega) \cdot \sin(\omega t + a) \quad (26)$$

Thus, step-size parameter "μ" applied to the adaptive control algorithm is corrected to a value which is inversely proportional to the gain characteristic value of the changed signal transmission characteristics from vibrational noise canceller 30 to microphone 15. As a result, the product γ·β of signal transmission characteristics "γ" and "β" can be kept constant, thereby maintaining the performance of the active noise controller.

INDUSTRIAL APPLICABILITY

The active noise controller of the present invention can determine the signal transmission characteristics from the vibrational noise canceller having a speaker to the error signal generator having a microphone without using any special external measuring instrument. The active noise controller can also calculate the cosine correction value and sine correction value of the signal transmission characteristics without using an external computer, and can store the cosine correction value and the sine correction value to the memory of the corrector. The active noise controller has high industrial applicability because it can actively reduce vibrational noise by using the cosine correction value and sine correction value thus calculated.

The invention claimed is:

1. An active noise controller comprising:

a mode selector for selecting between normal mode and measurement mode;

a frequency detector for detecting a frequency of vibrational noise generated from a vibrational noise source based on the normal mode selected by the mode selector;

a pseudo-vibrational noise generator for outputting a signal in a predetermined frequency range corresponding to the frequency of the vibrational noise generated from the vibrational noise source, based on the measurement mode selected by the mode selector;

a first switch for selecting between the output signal of the pseudo-vibrational noise generator and an output signal of the frequency detector, and outputting the output signal selected;

a reference cosine wave generator and a reference sine wave generator for receiving the output signal of the first switch;

a first adaptive notch filter for outputting a first control signal based on the reference cosine wave signal outputted from the reference cosine wave generator in order to cancel the vibrational noise generated, based on the vibrational noise from the vibrational noise source;

a second adaptive notch filter for outputting a second control signal based on the reference sine wave signal outputted from the reference sine wave generator;

a first adder for receiving the first control signal and the second control signal;

a second switch for receiving a signal outputted from the first adder;

a third switch for receiving one of the reference cosine wave signal and the reference sine wave signal;

a vibrational noise canceller for canceling the vibrational noise generated, the vibrational noise canceller receiving an output of the second switch and an output of the third switch;

an error signal detector for outputting an error signal resulting from interference between the vibrational noise generated and a noise-canceling sound outputted from the vibrational noise canceller;

a fourth switch for receiving the output of the first adder;

a second adder for receiving an output of the fourth switch and the output of the error signal detector;

a fifth switch for receiving the reference cosine wave signal;

a sixth switch for receiving the reference sine wave signal;

a first filter coefficient updater for calculating a filter coefficient of the first adaptive notch filter based on an output signal of the second adder and an output signal of the fifth switch so as to minimize the output signal of the second adder, and for updating the filter coefficient sequentially;

a second filter coefficient updater for calculating a filter coefficient of the second adaptive notch filter based on the output signal of the second adder and an output signal of the sixth switch so as to minimize the output signal of the second adder, and for updating the filter coefficient sequentially;

a correction value calculator for receiving the filter coefficients of the first and second filter coefficient updaters, the correction value calculator being able to calculate at least a phase characteristic value out of a gain characteristic value and the phase characteristic value of signal transmission characteristics from the vibrational noise canceller to the error signal detector, corresponding to a frequency of one of the reference cosine wave signal and the reference sine wave signal, and also being able to calculate a cosine correction value and a sine correction value; and a corrector for correcting the reference cosine wave signal and the reference sine wave signal by using the cosine correction value and the sine correction value, respectively, and outputting a corrected cosine wave signal and a corrected sine wave signal to the fifth switch and the sixth switch, respectively, wherein the corrector comprises:

a memory for storing the cosine correction value and the sine correction value;

a first multiplier for forming a product of the cosine correction value and the reference cosine wave signal;

a second multiplier for forming a product of the sine correction value and the reference sine wave signal;

a third multiplier for forming a product of the cosine correction value and the reference sine wave signal;

a fourth multiplier for forming a product of the sine correction value and the reference cosine wave signal;

a third adder for receiving an output signal of the first multiplier and an output signal of the second multiplier separately, and outputting the corrected cosine wave signal; and a fourth adder for receiving an output of the third multiplier and an output of the fourth multiplier separately, and outputting the corrected sine wave signal.

2. The active noise controller of claim 1, wherein in the measurement mode, the first switch inputs the output signal of the pseudo-vibrational noise generator to the reference cosine wave generator and the reference sine wave generator;

the second switch prevents the output signal of the first adder from being inputted to the vibrational noise canceller;

the third switch inputs one of the reference cosine wave signal and the reference sine wave signal to the vibrational noise canceller;

the fourth switch inputs the output signal of the first adder to the second adder;

the fifth switch prevents the corrected cosine wave signal of the third adder from being inputted to the first filter coefficient updater, and inputs the reference cosine wave signal to the first filter coefficient updater;

the sixth switch prevents the corrected sine wave signal of the fourth adder from being inputted to the second filter coefficient updater, and inputs the reference sine wave signal to the second filter coefficient updater;

the correction value calculator calculates the cosine correction value and the sine correction value by using the filter coefficients of the first and second filter coefficient updaters for each output signal having the predetermined frequency outputted from the pseudo-vibrational noise generator; and the memory stores the cosine correction value and sine correction value corresponding to the each output signal having the predetermined frequency.

3. The active noise controller of claim 1, wherein in the normal mode, the first switch inputs the output signal of the frequency detector to the reference cosine wave generator and the reference sine wave generator;

the second switch inputs the output signal of the first adder to the vibrational noise canceller;

the third switch prevents one of the reference cosine wave signal and the reference sine wave signal from being inputted to the vibrational noise canceller;

the fourth switch prevents the output signal of the first adder from being inputted to the second adder;

the fifth switch inputs the corrected cosine wave signal outputted from the third adder to the first filter coefficient updater, and prevents the reference cosine wave signal from being inputted to the first filter coefficient updater;

the sixth switch inputs the corrected sine wave signal outputted from the fourth adder to the second filter coefficient updater, and prevents the reference sine wave signal from being inputted to the second filter number updater; and the vibrational noise canceller cancels the vibrational noise generated so as to minimize the signal of the second adder by using the corrected cosine wave signal, the corrected sine wave signal, and the output signal of the second adder, the corrected cosine wave signal and the corrected sine wave signal being respectively derived from the cosine correction value and sine correction value corresponding to each output signal having the predetermined frequency, which is calculated when the measurement mode is selected by the mode selector and stored in the memory.

4. The active noise controller of claim 1, wherein the mode selector is incorporated in an in-car apparatus and constructed so as to be able to select between the normal mode and the measurement mode by a predetermined operation.

5. The active noise controller of claim 4, wherein the in-car apparatus is one of an audio system and a navigation system.

6. The active noise controller of claim 4, wherein the mode selector is at least one of a touch panel having an operation input portion and a speech recognizer having a mechanical switch and a microphone.

7. The active noise controller of claim 1 further comprising:

a second memory for storing the gain characteristic value and phase characteristic value calculated by the correction value calculator; and a comparator for at least comparing a phase characteristic value calculated first with a phase characteristic value calculated later by the correction value calculator and determining whether difference between the phase characteristic values is within a predetermined value, out of a gain characteristic value and the phase characteristic value calculated first and a gain characteristic value and the phase characteristic value calculated later.

8. The active noise controller of claim 7, wherein the comparator issues a warning when the difference between the phase characteristic values exceeds the predetermined value.

9. The active noise controller of claim 7, wherein when the comparator determines that the difference between the phase characteristic values exceeds the predetermined value, the correction value calculator again calculates a cosine correction value and a sine correction value by using the filter coefficients outputted from the first and second filter coefficient updaters, respectively, and the memory stores the cosine correction value and the sine correction value.

10. The active noise controller of claim 2, wherein the mode selector is constructed to select the measurement mode when an engine is in a stopped state.

11. The active noise controller of claim 1 further comprising:

a plurality of vibrational noise cancellers; and a selector for selecting at least one of the plurality of vibrational noise cancellers.

12. The active noise controller of claim 1 further comprising:

a plurality of error signal detectors; and a selector for selecting at least one of the plurality of error signal detectors.

13. The active noise controller of claim 11, wherein at least one of the plurality of vibrational noise cancellers is selected for each output signal having the predetermined frequency, which is outputted from the pseudo-vibrational noise generator in the measurement mode.

14. The active noise controller of claim 12, wherein at least one of the plurality of error signal detectors is selected for each output signal having the predetermined frequency, which is outputted from the pseudo-vibrational noise generator in the measurement mode.

15. The active noise controller of any one of claims 11 to 14 further comprising:

a third memory for storing the gain characteristic value and the phase characteristic value, which are calculated by the correction value calculator, of the signal transmission characteristics from a selected vibrational noise canceller to a selected error signal detector, the third memory storing the gain characteristic value and the phase characteristic value for one of each of the plurality of vibrational noise cancellers and each of the plurality of error signal detector and;

a second comparator for comparing the gain characteristic and/or the phase characteristic stored in the third memory for one of each of the plurality of vibrational noise cancellers and each of the plurality of error signal detector.

16. The active noise controller of claim 15, wherein the second comparator compares at least one of between the gain characteristics and between the phase characteristics;

the correction value calculator calculates the cosine correction value and the sine correction value based on the gain characteristic value and phase characteristic value of the signal transmission characteristics which are selected from comparison results by a predetermined standard; and the memory stores calculation results.

17. The active noise controller of claim 15, wherein the second comparator compares between the gain characteristics and/or between the phase characteristics for each predetermined frequency and selects best signal transmission characteristics by a predetermined standard;

the correction value calculator calculates the cosine correction value and the sine correction value based on the gain characteristic value and phase characteristic value of the signal transmission characteristics selected; and the memory stores the cosine correction value and the sine correction value.

18. The active noise controller of claim 1 further comprising:

a first corrector for correcting one of the reference sine wave signal outputted from the reference sine wave generator and the reference cosine wave signal outputted from the reference cosine wave generator, wherein in the measurement mode, one of the reference sine wave signal and the reference cosine wave signal is corrected by the first corrector and inputted to the vibrational noise canceller by the third switch.

19. The active noise controller of claim 18, wherein in the measurement mode, the gain characteristic value of the signal transmission characteristics from the vibrational noise canceller to the error signal detector is calculated based on the filter coefficients determined in a manner described in claim 2 and a first correction value applied to the first corrector.

20. The active noise controller of claim 1 further comprising a seventh switch for receiving the reference cosine wave signal outputted from the reference cosine wave generator and the first control signal outputted based on the first adaptive notch filter;

an eighth switch for receiving the reference sine wave signal outputted from the reference sine wave generator and the second control signal outputted based on the second adaptive notch filter;

a second corrector for correcting the first control signal and making the seventh switch input a corrected signal to the first adder when the measurement mode is selected; and a third corrector for correcting the second control signal and making the eighth switch input a corrected signal to the first adder when the measurement mode is selected.

21. The active noise controller of claim 20, wherein in the measurement mode, the gain characteristic value of the signal transmission characteristics from the vibrational noise canceller to the error signal detector is calculated based on the filter coefficients determined in claim 2, a second correction value applied to the second corrector, and a third correction value applied to the third corrector.

22. The active noise controller of claim 1 further comprising a first corrector for correcting one of the reference sine wave signal outputted from the reference sine wave generator and the reference cosine wave signal outputted from the reference cosine wave generator;

a seventh switch for receiving the first control signal;

an eighth switch for receiving the second control signal;

a second corrector for correcting the first control signal and making the seventh switch input a corrected signal to the first adder when the measurement mode is selected; and a third corrector for correcting the second control signal and making the eighth switch input a corrected signal to the first adder when the measurement mode is selected.

23. The active noise controller of claim 22, wherein in the measurement mode, the gain characteristic value of the signal transmission characteristics from the vibrational noise canceller to the error signal detector is calculated based on the filter coefficients determined in a manner described in claim 2, a first correction value applied to the first corrector, a second correction value applied to the second corrector, and a third correction value applied to the third corrector.

24. The active noise controller of claim 1, wherein in the normal mode, a fourth corrector corrects the output signal of the first adder based on the gain characteristic value, which is calculated in a manner described in claim 23, of the signal transmission characteristics from the vibrational noise canceller to the error signal detector.

25. The active noise controller of claim 1, wherein in the normal mode, a predetermined parameter applied to the first filter coefficient updater and the second filter coefficient updater is corrected based on the gain characteristic value, which is calculated in a manner described in claim 23, of the signal transmission characteristics from the vibrational noise canceller to the error signal detector.

* * * * *